US008314756B2

(12) United States Patent
Rankov et al.

(10) Patent No.: US 8,314,756 B2
(45) Date of Patent: Nov. 20, 2012

(54) PIXEL DRIVER CIRCUITS COMPRISING A THIN FILM TRANSISTOR WITH A FLOATING GATE

(75) Inventors: Aleksandra Rankov, Huntingdon (GB); Euan C. Smith, Cambridgeshire (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 116 days.

(21) Appl. No.: 12/740,541

(22) PCT Filed: Oct. 29, 2008

(86) PCT No.: PCT/GB2008/051007

§ 371 (c)(1), (2), (4) Date: May 27, 2010

(87) PCT Pub. No.: WO2009/056877

PCT Pub. Date: May 7, 2009

(65) Prior Publication Data

US 2010/0253710 A1 Oct. 7, 2010

(30) Foreign Application Priority Data

Nov. 2, 2007 (GB) .................................. 0721567.6
Dec. 6, 2007 (GB) .................................. 0723859.5

(51) Int. Cl.

| | |
|---|---|
| ***G09G 3/30*** | (2006.01) |
| ***G09G 3/32*** | (2006.01) |
| ***G09G 3/36*** | (2006.01) |
| ***G09G 5/00*** | (2006.01) |
| ***G09G 5/10*** | (2006.01) |
| ***G06F 3/038*** | (2006.01) |
| ***H01L 29/66*** | (2006.01) |

(52) U.S. Cl. ................ 345/77; 345/76; 345/82; 345/92; 345/204; 345/690; 257/261

(58) Field of Classification Search .................... 345/36, 345/44–46, 76
See application file for complete search history.

(56) References Cited

U.S. PATENT DOCUMENTS 4,112,333 A 9/1978 Asars et al.

(Continued)

FOREIGN PATENT DOCUMENTS

EP 0717466 A2 6/1996

(Continued)

OTHER PUBLICATIONS

Shirasaki et al., "Solution for Large-Area Full-Color OLED Television—Light Emitting Polymer and a-Si TFT Technologies," 11th International Display Workshops, IDW '04 Conference Proceedings, pp. 275-278 (2004).

(Continued)

*Primary Examiner* — Bipin Shalwala
*Assistant Examiner* — Ryan A Lubit
(74) *Attorney, Agent, or Firm* — Marshall, Gerstein & Borun LLP

(57) ABSTRACT

This invention relates to pixel driver circuits for active matrix optoelectronic devices, in particular OLED (organic light emitting diodes) displays. We describe an active matrix optoelectronic device having a plurality of active matrix pixels each said pixel including a pixel circuit comprising a thin film transistor (TFT) for driving the pixel and a pixel capacitor for storing a pixel value, wherein said TFT comprises a TFT with a floating gate.

22 Claims, 12 Drawing Sheets

U.S. PATENT DOCUMENTS

| | | | | |
|---|---|---|---|---|
| 4,539,507 | A | 9/1985 | VanSlyke et al. | |
| 5,661,421 | A * | 8/1997 | Ohmi et al. | 327/63 |
| 5,982,462 | A * | 11/1999 | Nakano et al. | 349/43 |
| 6,501,466 | B1 * | 12/2002 | Yamagishi et al. | 345/204 |
| 2002/0079484 | A1 * | 6/2002 | Yamazaki et al. | 257/10 |
| 2004/0183758 | A1 * | 9/2004 | Chen et al. | 345/76 |
| 2005/0007320 | A1 * | 1/2005 | Smith et al. | 345/77 |
| 2008/0007499 | A1 * | 1/2008 | Kawabe | 345/82 |
| 2008/0315759 | A1 * | 12/2008 | Chung | 313/504 |

FOREIGN PATENT DOCUMENTS

| | | | |
|---|---|---|---|
| JP | 2003-271095 | | 9/2003 |
| JP | 2003/271095 | A | 9/2003 |
| WO | WO-90/13148 | A1 | 11/1990 |
| WO | WO-95/06400 | A1 | 3/1995 |
| WO | WO-99/21935 | A1 | 5/1999 |
| WO | WO-99/42983 | A1 | 8/1999 |
| WO | WO-99/48160 | A1 | 9/1999 |
| WO | WO-02/067343 | A1 | 8/2002 |
| WO | WO-03/038790 | A2 | 5/2003 |
| WO | WO-03/105117 | A2 | 12/2003 |
| WO | WO-2004/023444 | A1 | 3/2004 |
| WO | WO-2005116970 | A1 | 12/2005 |

OTHER PUBLICATIONS

Combined Search and Examination Report for Application No. GB0721567.6, dated Feb. 29, 2008.

International Search Report and Written Opinion for PCT/GB2008/051007 dated Jan. 23, 2009.

Dawson et al., “The Impact of the Transient Response of Organic Light Emitting Diodes on the Design of Active Matrix OLED Displays,” *IEEE International Electron Device Meetting*, San Francisco, CA, 875-878. http://ieeexplore.ieee.org/xpl/freeabs_all.jsp?arnumber=746494.

Dawson et al., “The Impact of the Transient Response of Organic Light Emitting Diodes on the Design of Active Matrix OLED Displays,” IEEE International Electron Device Meeting, San Francisco, CA, 875-878 (1998). http://ieeexplore.ieee.org/xpl/freeabs_all.jsp?arnumber=746494.

* cited by examiner

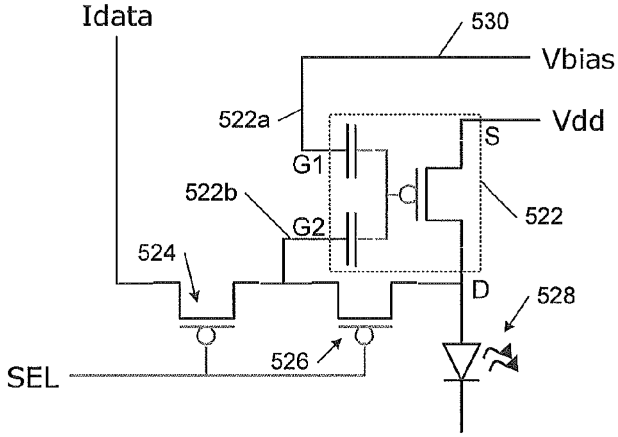
Figure 5f
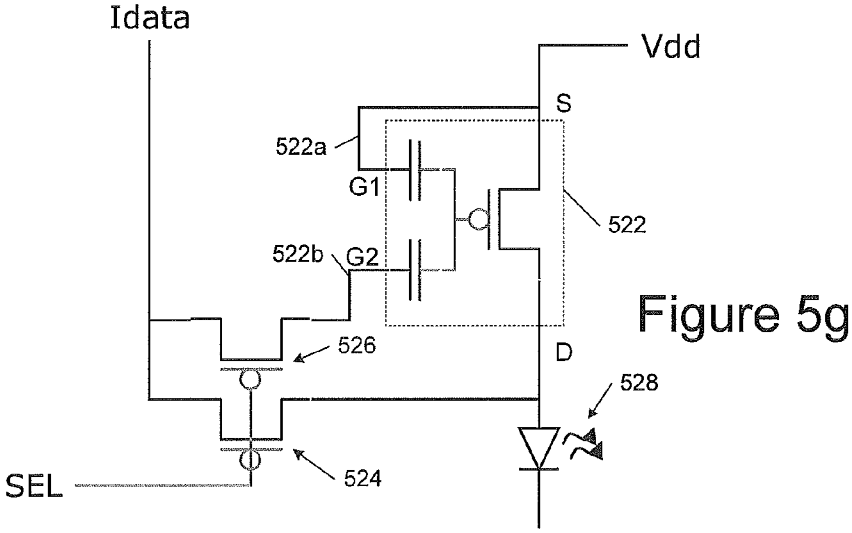
Figure 5g
Figure 5h
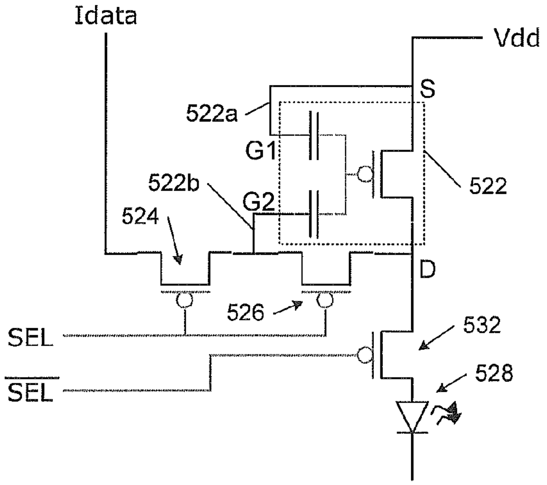

PIXEL DRIVER CIRCUITS COMPRISING A THIN FILM TRANSISTOR WITH A FLOATING GATE

FIELD OF THE INVENTION

This invention relates to pixel driver circuits for active matrix optoelectronic devices, in particular OLED (organic light emitting diodes) displays.

BACKGROUND TO THE INVENTION

Embodiments of the invention will be described while particularly useful in active matrix OLED displays although applications and embodiments of the invention are not limited to such displays and may be employed with other types of active matrix display and also, in embodiments, in active matrix sensor arrays.

Organic Light Emitting Diode Displays

Organic light emitting diodes, which here include organometallic LEDs, may be fabricated using materials including polymers, small molecules and dendrimers, in a range of colours which depend upon the materials employed. Examples of polymer-based organic LEDs are described in WO 90/13148, WO 95/06400 and WO 99/48160; examples of dendrimer-based materials are described in WO 99/21935 and WO 02/067343; and examples of so called small molecule based devices are described in U.S. Pat. No. 4,539,507. A typical OLED device comprises two layers of organic material, one of which is a layer of light emitting material such as a light emitting polymer (LEP), oligomer or a light emitting low molecular weight material, and the other of which is a layer of a hole transporting material such as a polythiophene derivative or a polyaniline derivative.

Organic LEDs may be deposited on a substrate in a matrix of pixels to form a single or multi-colour pixellated display. A multicoloured display may be constructed using groups of red, green, and blue emitting sub-pixels. So-called active matrix displays have a memory element, typically a storage capacitor, and a transistor, associated with each pixel (whereas passive matrix displays have no such memory element and instead are repetitively scanned to give the impression of a steady image). Examples of polymer and small-molecule active matrix display drivers can be found in WO 99/42983 and EP 0,717,446A respectively.

It is common to provide a current-programmed drive to an OLED because the brightness of an OLED is determined by the current flowing through the device, this determining the number of photons it generates, whereas in a simple voltage-programmed configuration it can be difficult to predict how bright a pixel will appear when driven.

Background prior art relating to voltage programmed active matrix pixel driver circuits can be found in Dawson et al, (1998), "The impact of the transient response of organic light emitting diodes on the design of active matrix OLED displays", IEEE International Electron Device Meeting, San Francisco, Calif., 875-878. Background prior art relating to current programmed active matrix pixel driver circuits can be found in "Solution for Large-Area Full-Color OLED Television—Light Emitting Polymer and a-Si TFT Technologies", T. Shirasaki, T. Ozaki, T. Toyama, M. Takei, M. Kumagai, K. Sato, S. Shimoda, T. Tano, K. Yamamoto, K. Morimoto, J. Ogura and R. Hattori of Casio Computer Co Ltd and Kyushu University, Invited paper AMD3/OLED5-1, $11^{th}$ International Display Workshops, 8-10 Dec. 2004, IDW '04 Conference Proceedings pp 275-278. Further background prior art can be found in U.S. Pat. No. 5,982,462 and in JP2003/271095.

FIGS. 1*a* and 1*b*, which are taken from the IDW '04 paper, show an example current programmed active matrix pixel circuit and a corresponding timing diagram. In operation, in a first stage the data line is briefly grounded to discharge Cs and the junction capacitance of the OLED (Vselect, Vreset high; Vsource low). Then a data sink Idata is applied so that a corresponding current flows through T3 and Cs stores the gate voltage required for this current (Vsource is low so that no current flows through the OLED, and T1 is on so T3 is diode connected). Finally the select line is de-asserted and Vsource is taken high so that the programmed current (as determined by the gate voltage stored on Cs) flows through the OLED ($I_{OLED}$).

There is, however, a need for improved pixel driver circuits.

SUMMARY OF INVENTION

According to a first aspect of the invention there is therefore provided an active matrix optoelectronic device having a plurality of active matrix pixels each said pixel including a pixel circuit comprising a thin film transistor (TFT) for driving the pixel and a pixel capacitor for storing a pixel value, wherein said TFT comprises a TFT with a floating gate.

In embodiments the floating gate TFT has one or more capacitively coupled input terminals to the floating gate, coupled via input capacitors. In embodiments there are no other connections to the floating gate other than through the input capacitors (ie. no direct or resistive inputs). The floating gate and associated gate connection(s) may be integrated within the TFT structure or the floating gate may comprise a gate connection to the TFT which is substantially resistively isolated from the remainder of the pixel circuit—that is it has only one or more capacitative connection(s) to the remainder of the pixel circuit ("non-integrated"). In a non-integrated device the input capacitors therefore may be devices patterned separately to the floating gate TFT.

The "non-integrated" configuration is particularly useful as it enables vias between gate and drain-source metal layers to be avoided. This is because one plate of a coupling capacitor may be patterned in the source-drain layer. Thus in embodiments where a floating gate device with non-integrated input capacitors is employed the use of a said Floating Gate (FG) device avoids the need for an additional via typically between a gate layer of the drive TFT and the drain-source layer of a control or switching TFT.

In some particularly preferred embodiments the driver TFT has two inputs each with an associated capacitive connection to the FG of the device. One of these input capacitances may be employed for storing a voltage which modulates the threshold voltage of the drive TFT whilst the other may be used as the programming input, in an OLED display for controlling the brightness of an OLED pixel driven by the drive TFT.

In embodiments with two capacitively coupled input terminals the additional flexibility afforded by the second input terminal facilitates the fabrication of pixel circuits with an increased operating efficiency and/or the ability for greater control of the operation of the circuit. Thus in embodiments one of the input terminals and its associated capacitance may be employed for compensation of pixel brightness and/or colour for one or more of aging, temperature and positional non-uniformity. An input terminal may be employed to tune one or more parameters of the pixel circuit and/or to programme the pixel circuit to set a pixel brightness (here brightness includes the brightness of a colour sub-pixel of a multicolour display).

In still further embodiments the additional capacitively coupled input terminal may be employed to provide compensation for mis-match between devices, for example to compensate for variations due to device mis-match in a current mirror based pixel circuit.

In still other pixel circuits the effective threshold voltage of a FG thin film transistor may be reduced to zero or even inverted by applying a voltage to one (or more) of the capacitively coupled input terminals of the FG transistor. This can reduce the input voltage required for a given drain-source current, thus reducing the required drain-source voltage (Vds), in particular if it is preferred that the device operates in saturation. This can therefore reduce power requirements and increase operating efficiency.

Furthermore, ability to change the effective threshold voltage is beneficial for circuits that need tuning and programming, where mismatch needs to be corrected between adjacent transistors.

As previously mentioned, in preferred embodiments the active matrix optoelectronic device comprises an OLED device and the pixel circuit includes an OLED driven by the TFT. In still other embodiments the active matrix device may comprise an active matrix sensor, or an active matrix sensor in combination with an active matrix display device.

In some embodiments the pixel circuit comprises a voltage-programmed pixel circuit—that is a programming voltage applied to the pixel circuit controls the pixel brightness (or colour). The pixel value stored on input capacitor may then include a threshold offset voltage value to offset a threshold voltage of the TFT. Where the drive TFT has two capacitively coupled input terminals, an input terminal may be employed to set a programming voltage for the pixel. In some embodiments the pixel circuit may include opto-feedback, for example comprising a photodiode coupled to an input terminal of the FG drive TFT. In embodiments a control circuit for such a voltage-programmed pixel has two cycles, a first cycle in which the threshold offset voltage value is stored, and a second cycle in which the brightness of the OLED is set by a programming voltage adjusted or modulated by the threshold offset voltage value.

In other embodiments the pixel circuit comprises a current programmed pixel circuit and a voltage stored on the input capacitor comprises a voltage programmed by a current applied to a current data line for the pixel circuit. Again, in embodiments, a second capacitively coupled input terminal to the FG of FG TFT may be employed to modulate a threshold voltage of the TFT. The skilled person will appreciate, however, that even where two separate capacitively coupled input terminals are provided a common floating gate within the TFT structure may be employed for both connections (one plate of the capacitor is common, and for the opposite plates each input is connected to a different plate).

In embodiments of the current programmed pixel circuit in which the drive TFT has two input terminals capacitively coupled to the FG of drive TFT a first input terminal may be coupled to a source (or drain) connection of the drive TFT, either directly or indirectly via one or more switching or select transistors. Such a select transistor may be controlled (switched on) to enable current programming of the pixel circuit. In embodiments one select transistor may be provided for programming and another for diode connecting the drive TFT, or both functions may be implemented by a single select transistor.

In embodiments another capacitively coupled input terminal of the drive TFT may also be coupled to a pixel select transistor (either one of the aforementioned select transistors, or a further select transistor). This select transistor may be coupled between the second capacitively coupled input terminal of the drive TFT and a drain connection of the drive TFT, or it may be coupled to a bias voltage connection for the pixel circuit, for example to enable application of a bias voltage to adjust the threshold voltage of the drive TFT (for example, increasing Vt so that it reverse biases the oled during programming time).

Embodiments of the current programmed pixel circuit include a current data line which may be selectively connected to one of the capacitively coupled input terminals of the drive TFT, by a select transistor (either one of the aforementioned transistors or a further select transistor) to selectively provide programming current to the pixel circuit and to enable a gate voltage corresponding to the programming current to be stored on the input capacitor associated with a floating gate connection. Embodiments of the circuit may also include a disable transistor coupled between the drive TFT and the OLED for disabling illumination from the OLED during programming.

In still other embodiments the pixel circuit comprises a current mirror or other current copier circuit in which case the drive TFT may comprise an input or an output transistor of the current mirror or current copier. Thus in embodiments one or more transistors in the current mirror or current copier circuit may have one or more FG devices with some of the input terminals used, for example, for tuning the characteristics of the devices to more closely match one another.

In a related aspect the invention provides a method of driving an active matrix pixel circuit of an organic electroluminescent display, in particular as described above, said pixel circuit comprising a thin film transistor (TFT) for driving the pixel and a pixel capacitor for storing a pixel value, wherein said TFT comprises a TFT with a floating gate, wherein said floating gate has an associated floating gate capacitance, the method comprising programming said pixel circuit to store a voltage on said floating gate to source capacitor, wherein said stored voltage defines a brightness of said organic electroluminescent display element.

As previously described, the floating gate TFT preferably has one or more capacitively coupled input terminals to the floating gate, coupled via one or more input capacitors. These may be integrated with the floating gate TFT or patterned separately to the floating gate TFT and with no other connections to the floating gate other than through these input capacitors. Thus the pixel capacitor may comprise such an input capacitor.

In preferred embodiments the method further comprises setting the voltage defining the pixel brightness on an input capacitor coupled to one of the input connections and storing a voltage to modulate a threshold voltage of the TFT on an input capacitor coupled to a second input connection. The input capacitors may be integrated or non-integrated.

In a still further aspect the invention provides a floating gate organic thin film transistor comprising at least one input terminal capacitively coupled to a floating gate of the thin film transistor. In embodiments the input terminal comprises a floating gate connection to an integrated floating gate capacitor.

The skilled person will understand that in the above described aspects and embodiments of the invention the floating gate transistor may be either an n-channel or a p-channel transistor.

BRIEF DESCRIPTION OF THE DRAWINGS

These and other aspects of the invention will now be further described, by way of example only, with reference to the accompanying figures in which:

FIGS. 5*a* to 5*h* show examples of current programmed pixel circuits according to embodiments of an aspect of the invention;

DETAILED DESCRIPTION OF PREFERRED EMBODIMENTS

Active Matrix Pixel Circuits

Figure 1A:
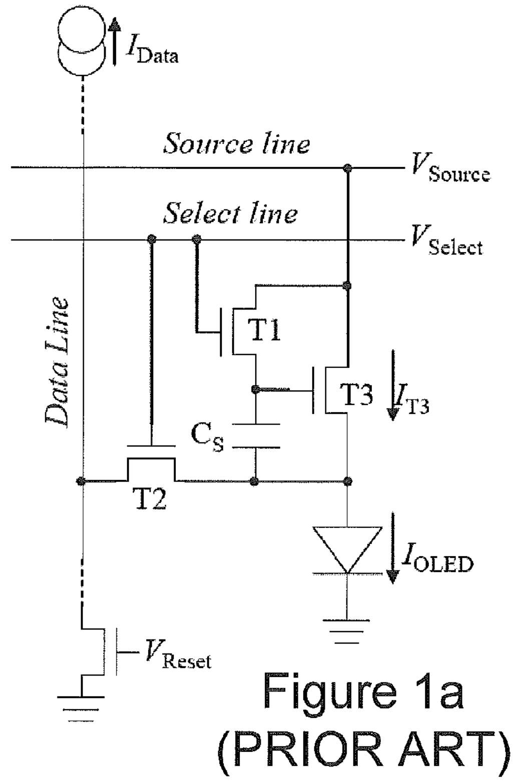
Figure 1a (PRIOR ART)
FIGS. 1*a* to 1*g* show examples of pixel circuits according to the prior art and a corresponding timing diagram, and further examples of active matrix pixel driver circuits.
Figure 1B:
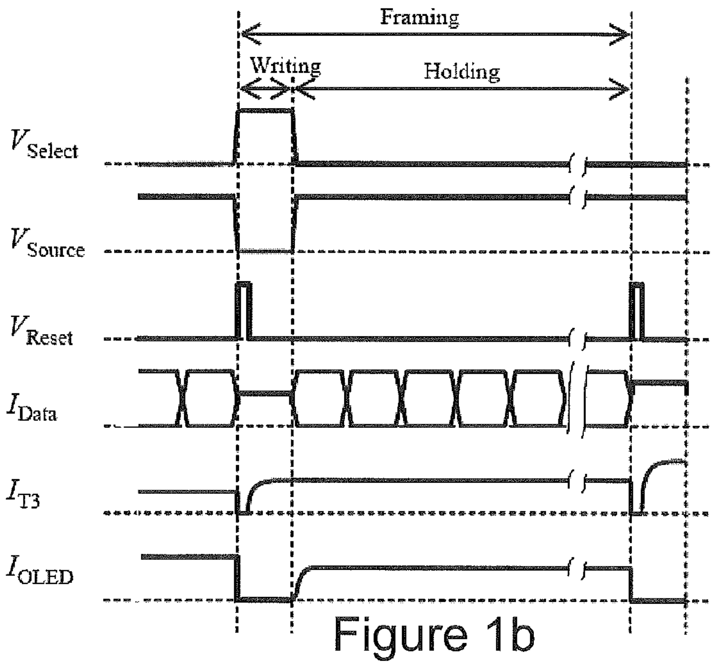
Figure 1b (PRIOR ART)
Figure 1C:
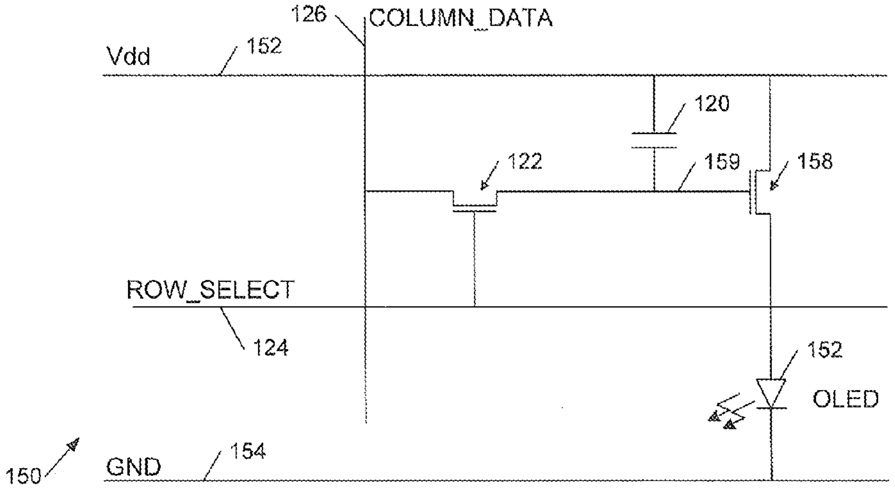
Figure 1C Prior Art

FIG. 1*c* shows an example of a voltage programmed OLED active matrix pixel circuit 150. A circuit 150 is provided for each pixel of the display and Vdd 152, Ground 154, row select 124 and column data 126 busbars are provided interconnecting the pixels. Thus each pixel has a power and ground connection and each row of pixels has a common row select line 124 and each column of pixels has a common data line 126.

Each pixel has an OLED 152 connected in series with a driver transistor 158 between ground and power lines 152 and 154. A gate connection 159 of driver transistor 158 is coupled to a storage capacitor 120 and a control transistor 122 couples gate 159 to column data line 126 under control of row select line 124. Transistor 122 is a thin film field effect transistor (TFT) switch which connects column data line 126 to gate 159 and capacitor 120 when row select line 124 is activated. Thus when switch 122 is on a voltage on column data line 126 can be stored on a capacitor 120. This voltage is retained on the capacitor for at least the frame refresh period because of the relatively high impedances of the gate connection to driver transistor 158 and of switch transistor 122 in its "off" state.

Driver transistor 158 is typically a TFT and passes a (drain-source) current which is dependent upon the transistor's gate voltage less a threshold voltage. Thus the voltage at gate node 159 controls the current through OLED 152 and hence the brightness of the OLED.

Figure 1D:
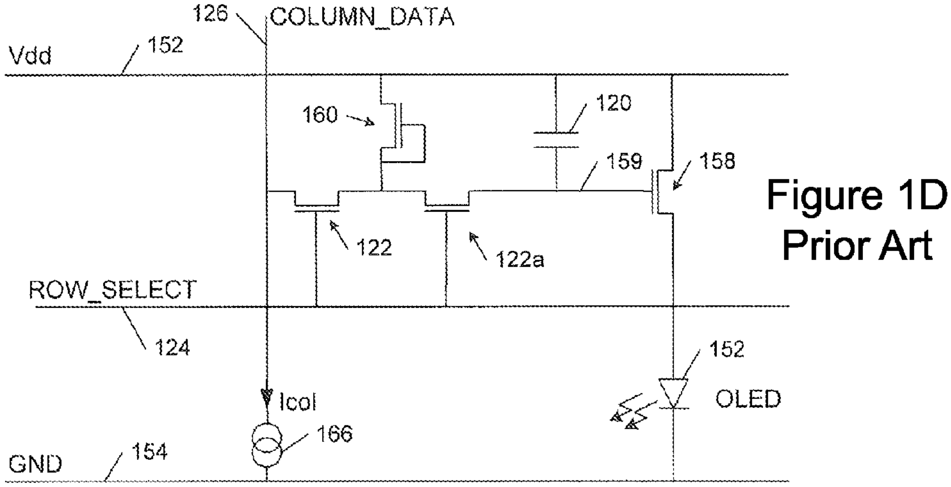
Figure 1D Prior Art
Figure 1E:
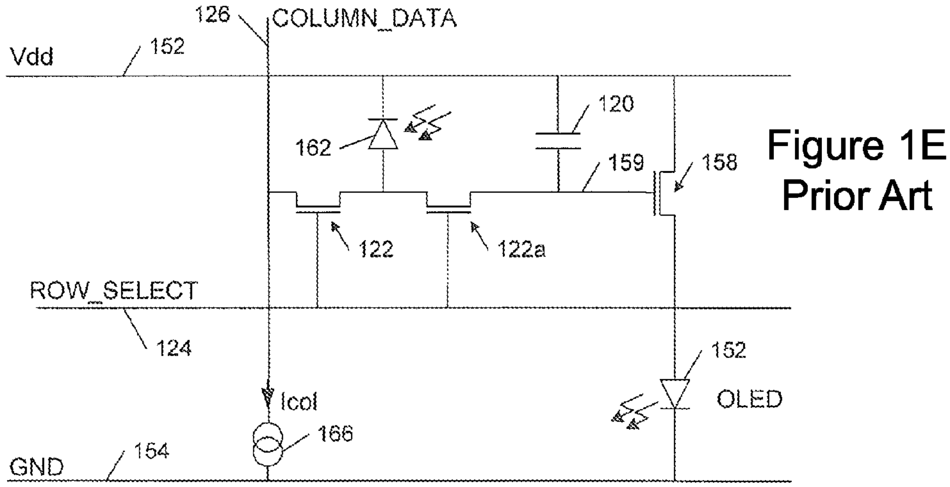
Figure 1E Prior Art

The voltage-programmed circuit of FIG. 1*c* suffers from a number of drawbacks, in particular because the OLED emission depends non-linearly on the applied voltage, and current control is preferable since the light output from an OLED is proportional to the current it passes. FIG. 1*d* (in which like elements to those of FIG. 1*c* are indicated by like reference numerals) illustrates a variant of the circuit of FIG. 1*c* which employs current control. More particularly a current on the (column) data line, set by current generator 166, "programs" the current through thin film transistor (TFT) 160, which in turn sets the current through OLED 152, since when transistor 122*a* is on (matched) transistors 160 and 158 form a current mirror. FIG. 1*e* illustrates a further variant, in which TFT 160 is replaced by a photodiode 162, so that the current in the data line (when the pixel driver circuit is selected) programs a light output from the OLED by setting a current through the photodiode.

Figure 1F:
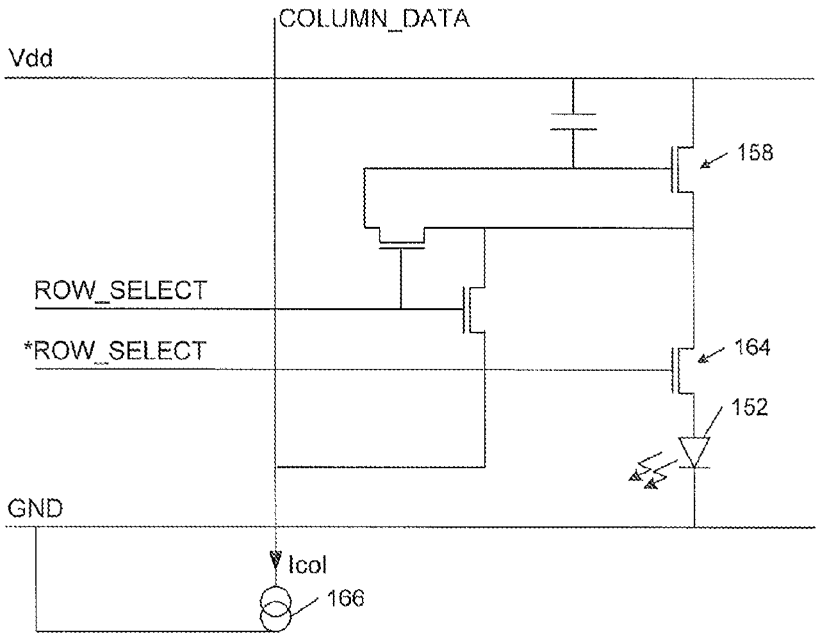
Figure 1F Prior Art
Figure 1G:
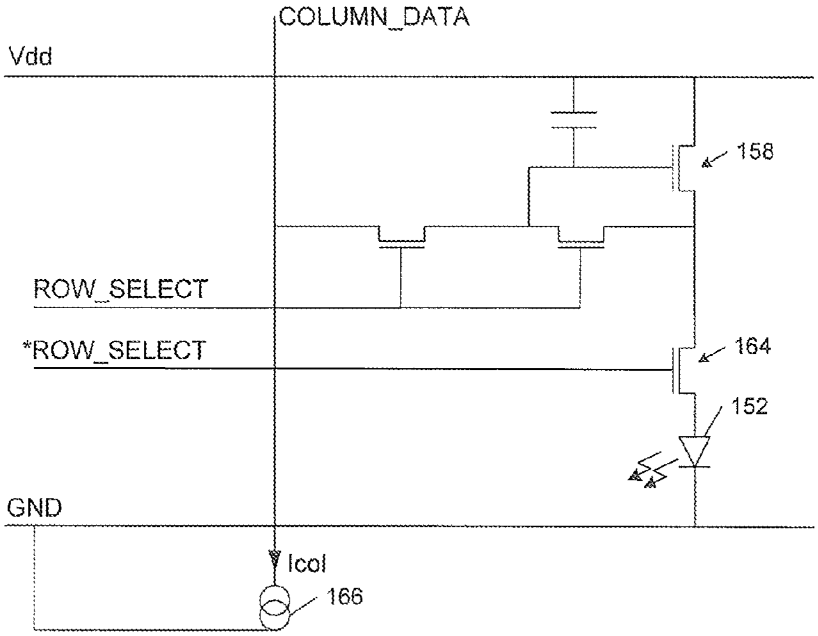
Figure 1G Prior Art

FIG. 1*f*, which is taken from our application WO03/038790, shows a further example of a current-programmed pixel driver circuit. In this circuit the current through an OLED 152 is set by setting a drain source current for OLED driver transistor 158 using a current generator 166, for example a reference current sink, and memorizing the driver transistor gate voltage required for this drain-source current. Thus the brightness of OLED 152 is determined by the current, flowing into reference current sink 166, which is preferably adjustable and set as desired for the pixel being addressed. In addition, a further switching transistor 164 is connected between drive transistor 158 and OLED 152 to prevent OLED illumination during the programming phase. In general one current sink 166 is provided for each column data line. FIG. 1*g* shows a variant of the circuit of FIG. 1*f*.

Figure 2:
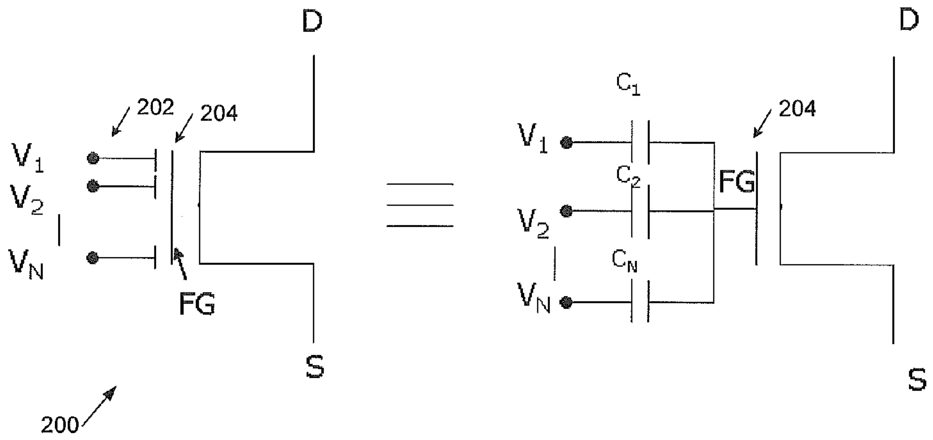
FIG. 2 shows a schematic representation of a floating gate TFT (thin film transistor)

Referring to FIG. 2 this shows a schematic diagram of a floating gate thin film transistor 200 with drain (D), source (S) and multiple 202 input terminals capacitively coupled to the FG 204 of the transistor each with a respective applied voltage $V_1, V_2, \ldots V_N$. The transistor 200 also incorporates a floating gate (FG) 204. FIG. 2 also illustrates how the multiple input terminals and floating gate of the transistor may be considered as a set of capacitors $C_1, C_2 \ldots C_N$. This latter representation is employed in the later described pixel circuits.

Figure 3A:
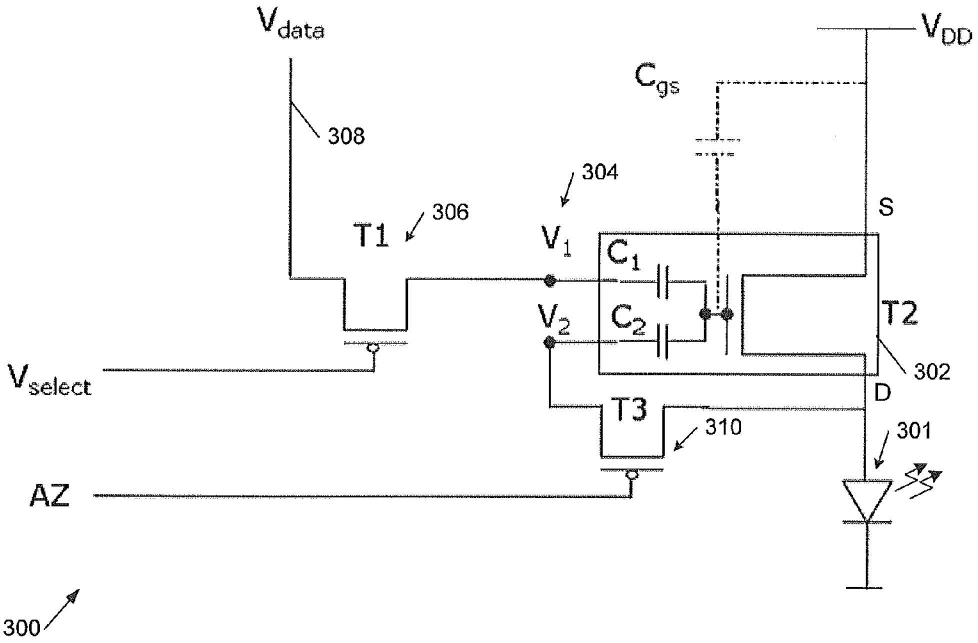
FIGS. 3*a* to 3*c* show, respectively, examples of voltage programmed pixel circuits according to embodiments of an aspect of the invention.

Referring now to FIG. 3*a*, this shows a first example of a voltage programmed pixel circuit 300 comprising a floating gate drive transistor 302 with multiple input terminals 304 each with an associated capacitive coupling to the floating gate of the TFT 302 (T2). The inherent gate-source capacitance $C_{gs}$ is also shown dashed (when T2 is on this comprises a parasitic capacitance of the transistor plus a portion of the channel capacitance; in the off state this is solely parasitic). Typically this parasitic capacitance is increased through increasing the overlap area between the gate and source to provide the circuit storage capacitance. Drive transistor 302 drives an OLED 301. A first select transistor 306 (T1) selectively couples one of the input terminals of the floating gate driving TFT to a data line 308 bearing a programming voltage for the pixel circuit; and second select transistor 310 selectively couples the second input terminal of transistor 302 to the drain connection of transistor 302 in response to a signal on auto-zero line AZ. This provides an auto-zeroing function to compensate the pixel drive, for example for aging and/or non-uniformity. It will be understood that in the example circuit of FIG. 3*a* transistor 302 (T2) is a p-channel device.

Figure 3B:
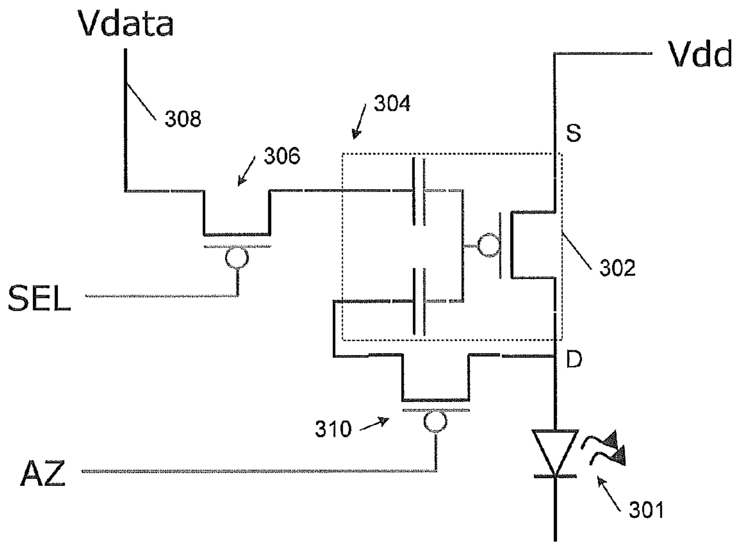

FIG. 3*b* shows the same circuit as FIG. 3*a*, but adopting slightly different representation.

Figure 3C:
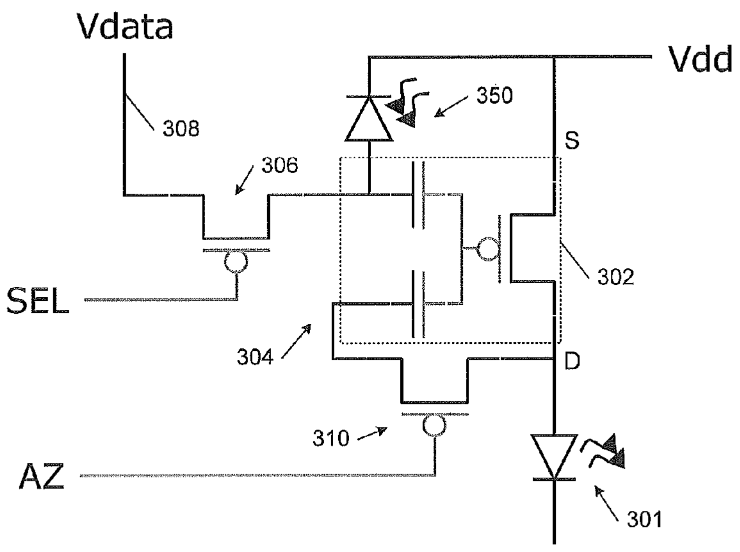

FIG. 3*c* shows a p-channel example of a variant of the circuit of FIGS. 3*a* and 3*b*, in which like elements are indicated by like reference numerals, the circuit of FIG. 3*c* including a photodiode 350, in a similar manner to the circuit of FIG. 1*e* described previously. This provides optical feedback when OLED 301 is on and provides an advantage over the arrangement of FIG. 1*e* in that the circuit corrects for differences or shifts in the threshold voltage Vt of transistor 302.

Figure 4:
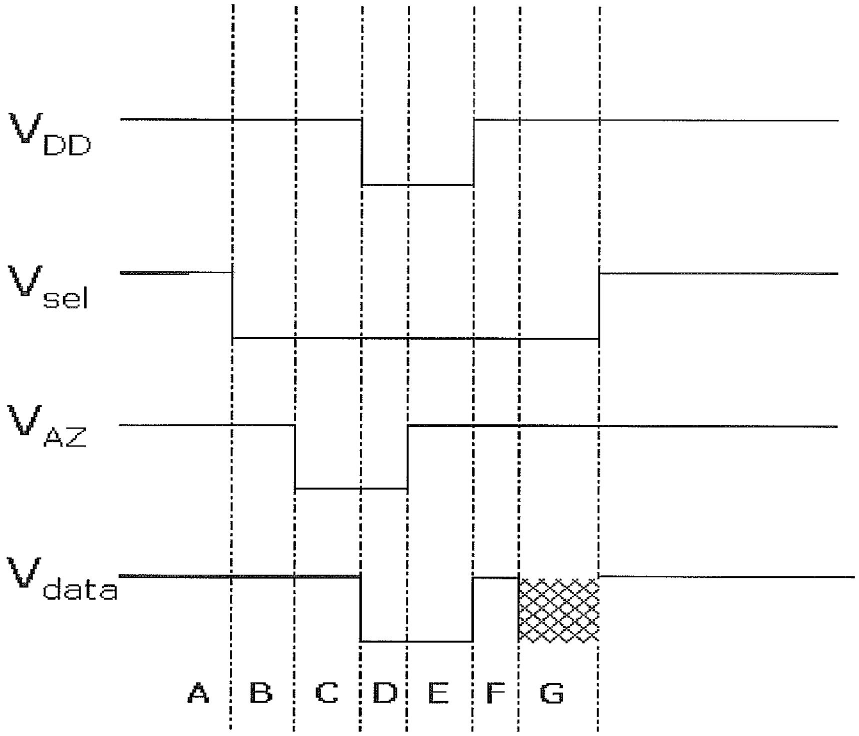
FIG. 4 shows a timing diagram illustrating the operation of a voltage programmed pixel circuit of the type shown in FIG. 3.

Referring now to FIG. 4, this shows a timing diagram illustrating operation of the circuits of FIG. 3 in more detail. The stages A-G in the operation of the active matrix pixel circuit of FIG. 3*a* are as described below:

A—pixel circuit is in OFF state; Vdata is disconnected from the pixel circuit; $C_1$ and $C_2$ capacitors float at an indeterminate state.

B—select switch is enabled and a reference data voltage (VHIGH) is applied to one input terminal ($V_1$=VHIGH) of the floating gate TFT 302 so it does not cause current through the floating gate TFT 302 ($|V_{FGS}|<|Vt|$); VDD is high.

C—AZ is low and T3 is enabled; the $V_2$ input of drive TFT (T2) is connected to the drain and so T2 302 is diode connected. The V1 input is still at VHIGH($V_1$=VHIGH). Current starts to conduct through T2 and Vgs/Vds increases. Charge redistributes between capacitors $C_1$, $C_2$ and Cgs.

D—$V_{DD}$ and $V_1$ (driven by the change in Vdata) go low by ΔV; $V_D$(T2) goes low and the OLED 301 is reverse biased. Current through T2 is redirected through enabled T3 into $C_2$, charging the capacitance C2. The voltage $V_2$ goes high and transistor 302 switches OFF when the threshold voltage is reached at the floating gate of TFT 302 (and Vt is recorded on Cgs).

E—AZ goes HIGH, T3 goes OFF and $V_2$ disconnects.

F—VDD and V1 (through T1 enabled) go HIGH again so that the OLED is in a forward biased state; and G—Data programmed onto T2 is offset by the threshold voltage Vt.

The skilled person will appreciate from the above description that the pixel circuits of FIG. 3 enable threshold voltage compensation in a voltage programmed pixel driver without requiring a TFT switch to disconnect the OLED (because this can effectively be accomplished by controlling an input voltage to reverse bias the OLED). Further in embodiments all the capacitors used can be provided by an integrated floating gate TFT as device 302. Alternatively if the circuits are constructed without integrated TFTs, then the design of the circuit layouts can avoid the need for vias between the gate and source/drain metal layers. The data voltage information programming the pixel is, in embodiments, stored by the capacitance $C_{gs}$ and hence is determined by the parasitic capacitance of the drive TFT 302 (T2). This is determined by the overlap area between the gate and the source, as well as by a portion of the channel capacitance of the drive TFT 302. This overlap may typically be increased in order to provide sufficient storage capacitance, or an external capacitance provided. The capacitors C1 and C2 can be integrated capacitances of the floating gate transistor 302 (T2), or separate components patterned next to the drive TFT, and comprise part of the circuit design; their values may be determined by choosing a geometric overlap area between the floating gate electrode and input terminal, regardless of being integrated or separated.

Figure 5A:
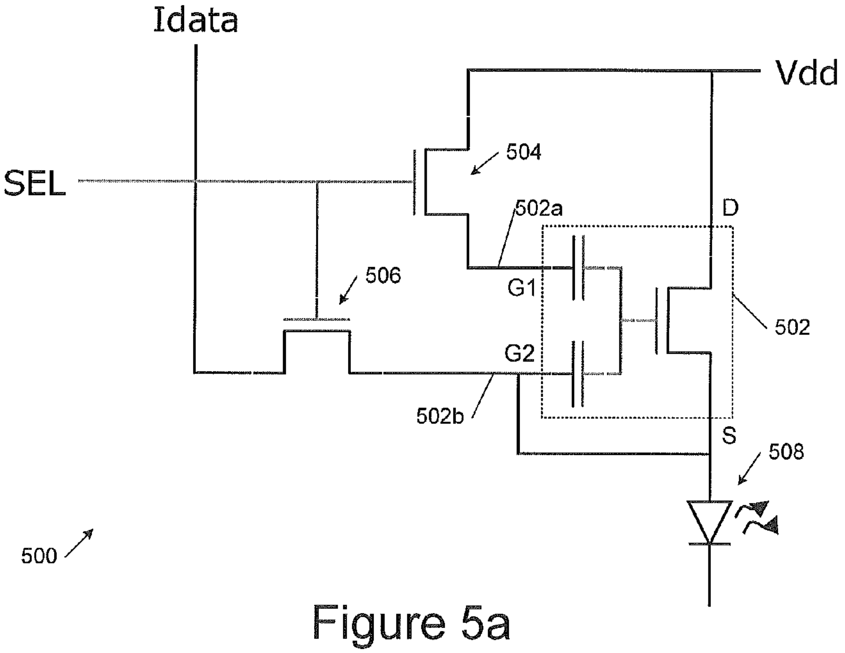

Referring now to FIG. 5*a*, this shows a first example of a current programmed active matrix pixel circuit 500 incorporating a floating gate drive transistor 502. The circuit of FIG. 5*a* can be compared with the circuit of FIG. 1*a*. One input terminal 502*a* (G1) of transistor 502 serves as a input connection for select transistor 504 (which corresponds to T1 in FIG. 1*a*). The other input terminal 502*b* (G2) is used to store the gate-source voltage programmed by the current set on the current dataline Idata on the input capacitance of transistor 502 when the second select transistor 506 to which this input terminal is coupled is switched on. Thus, in operation, when the SEL line is asserted both transistors 504 and 506 are switched on and to programme the pixel the Vdd line is taken low and a current sink is applied to the Idata line to set the voltage corresponding to the programmed current on input terminal capacitor of transistor of 502. The SEL line is then de-asserted and Vdd is taken high so that the programmed current flows through the OLED 508. A reset transistor (not shown in FIG. 5*a*) may be coupled to the Idata line to reset the voltage stored on input capacitor connected between input terminal G2 and FG prior to programming the output current.

The circuit of FIG. 5*a* can be fabricated with a reduced number of vias; an integrated input capacitor results in a smaller physical size for the pixel circuit. Thus the circuit can be implemented with an integrated floating gate device (i.e. with integrated input capacitors) to provide with a smaller physical size at the expense of a more complex layer structure, or with non-integrated input capacitors a simpler layer structure with fewer or no vias can be achieved.

Figure 5B:
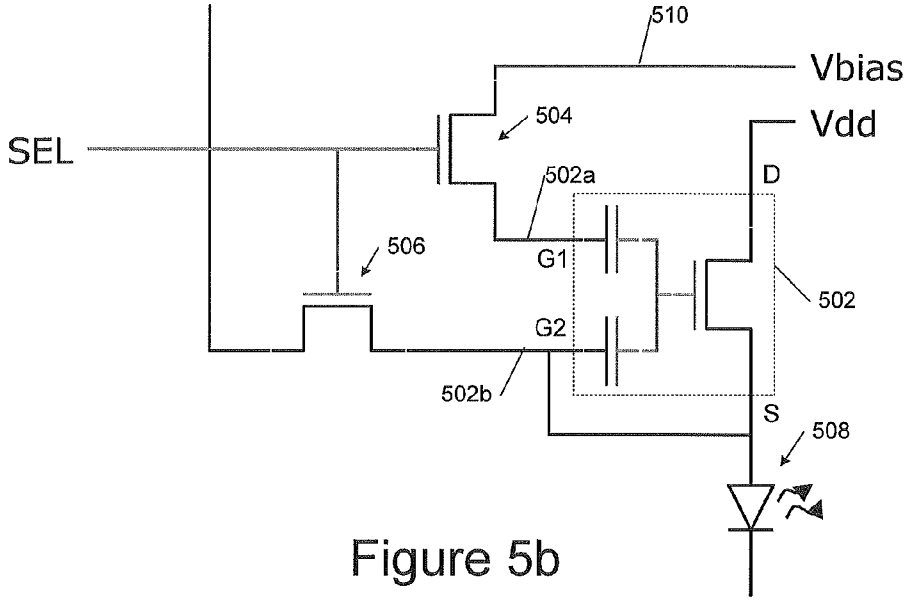

The circuit of FIG. 5*a* uses n-channel transistors but, as the skilled person would understand, p-channel transistors may alternatively be employed. Referring now to FIG. 5*b* this shows a variant of the circuit of FIG. 5*a* (in which like elements are indicated by like reference numerals, in which select transistor 504 is coupled to a bias line Vbias 510 rather than to Vdd. This bias line can be used to adjust the effective threshold voltage of the drive transistor by adjusting the voltage on an input terminal G1. In the case where the threshold voltage is non-zero, and therefore where, in programming a drive device through the use of diode connection, a larger drain-source voltage (than required to maintain saturation) would be produced, the threshold voltage for a floating gate device can be adjusted to zero thereby lowering the gate source voltage employed for the same OLED drive current. This in turn enables a lower Vdd to be employed, thus reducing the power consumption. The skilled person will understand that, in a similar way, rather than Vbias being adjusted in a positive direction to reduce Vt, Vbias may be adjusted in a negative direction to increase Vt.

The arrangement of FIG. 5*b* also facilitates an alternative mode of operation in which, during programming, rather than Vdd being sent to the lower voltage level to reverse bias the OLED the voltage on the Vbias line is controlled so that the OLED is not illuminated during current programming of the pixel circuit. This arrangement relies on adjusting Vbias in a positive direction to shift the programming voltage in a negative direction. After programming Vgs stays approximately constant (G1 in FIG. 5*b* essentially floats), as the source voltage rises and the OLED turns on.

Figure 5C:
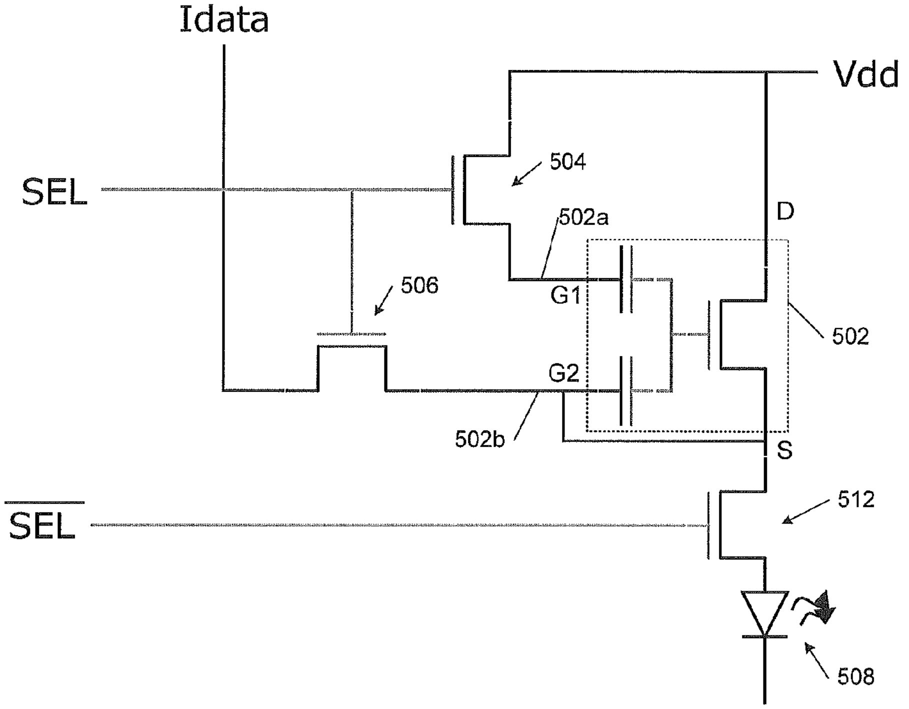

Referring now to FIG. 5*c*, this shows a further variant of the circuit of FIG. 5*a* again in which like elements are indicated by like reference numerals, this variant including a disable transistor 512 coupled to an inverted version of SEL line so that the OLED 508 may be actively switched off during programming rather than the Vdd taken low.

Figure 5D:
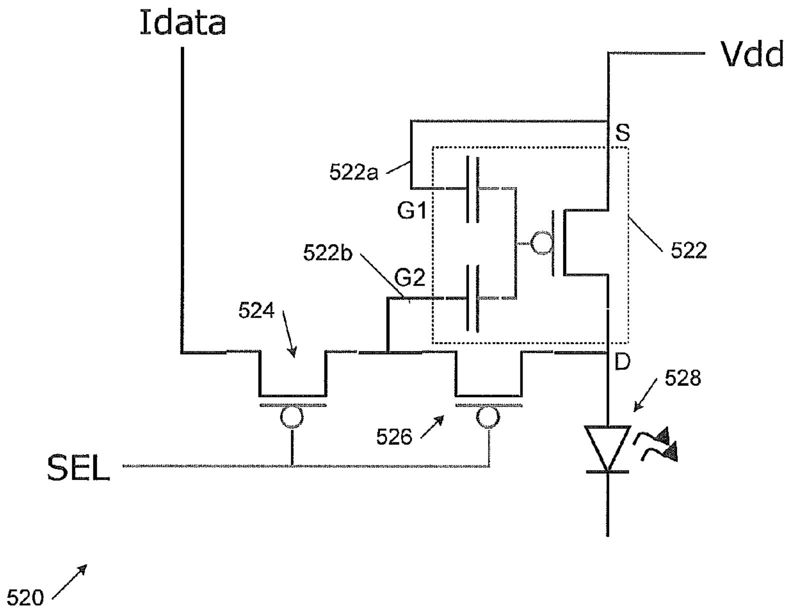

Referring next to FIG. 5*d*, this shows another example of a current programmed active matrix pixel circuit 520, the circuit using p-channel rather than n-channel devices. In the circuit of FIG. 5*d* drive transistor 522 has a first input terminal 522*a* (G1) which stores on a corresponding input capacitor a gate voltage programmed by a current on the data line when select transistors 524, 526 are on, whilst a second input terminal 522*b* (G2) serves as an additional input terminal for transistor 522 and is connected to the drain of the drive TFT—providing drive TFT is on and in saturation during programming. Again, during programming, select transistors 524, 526 are on and programming current flows from the Vdd line through drive transistor 522 to a programmable data sink (not shown) connected to the Idata line. When select transistors 524, 526 are switched off this current then flows through OLED 528 (during the programming phase the current through the OLED should be disabled).

Figure 5E:
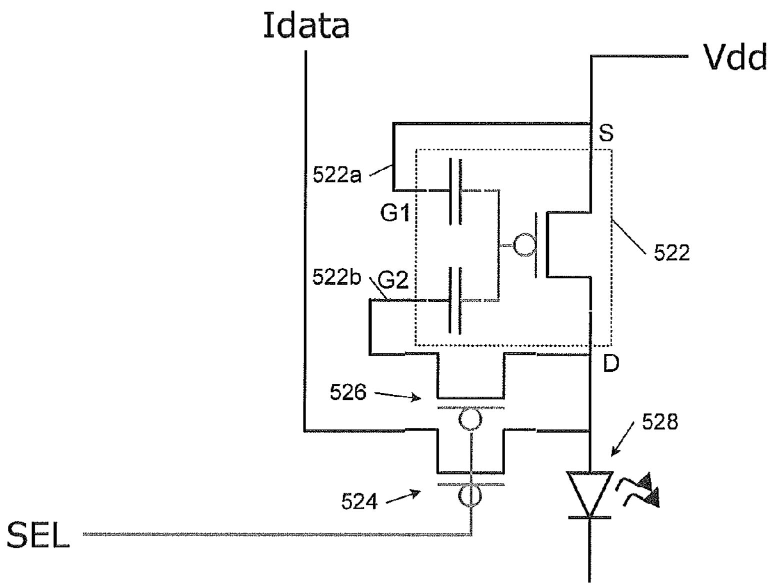

FIG. 5*e* illustrates a variant of the circuit of FIG. 5*d* in which, rather than select transistors 524, 526 being series coupled between the Idata line and the drain connection of drive transistor 522, one of the select transistors 526 is coupled between the drain terminal of drive transistor 522 and the second input terminal G2 522*b* of this transistor whilst the second select transistor 524 couples the Idata line directly to the drain terminal of drive transistor 522. This has the advantage that there is a single select transistor between the drive transistor output and the Idata line passing the programming current.

FIG. 5*f* shows a further variant of this circuit, in which like elements of those in FIG. 5*d* are indicated by like reference numerals, in which the input terminal G1 522*a* is connected to a bias voltage line Vbias 530 to allow adjustment/control of the threshold voltage of drive transistor 522 in a broadly similar manner to that described with reference to FIG. 5*b*.

Continuing to refer to an arrangement such as that illustrated in FIG. 5*f*, including a bias voltage line, if, in operation, one input terminal of the floating gate TFT is biased so as to increase the threshold voltage to a large value—which can be performed by biasing the bias voltage line positive (it is p-type)—the drain source voltage VDS across the drive TFT, when it is diode connected, can reverse bias the OLED and hence disable its operation during the programming cycle. Thus this provides a useful advantage since modulation (taking low) of the Vdd voltage is not required. In embodiments this can provide a power saving since there is generally a significant capacitance associated with this line. In embodiments the bias voltage in an active matrix display device may be shared between neighbouring pixels/lines of pixels.

FIG. 5*g* illustrates a further alternative circuit in which the select transistor 526 coupled to the second input terminal G2 522*b* of the drive transistor is directly coupled to the Idata line rather than to the drain terminal (or both as in 5*e*) of the drive transistor (so that the drain terminal is connected to the input terminal G2 via the series connected select transistors 524, 526).

FIG. 5*h* illustrates a still further variant of the current programmed circuit in which an additional OLED disable transistor 532 is provided so that the OLED can be actively switched off during programming (and hence Vdd need not be taken low during programming).

Figure 6A:
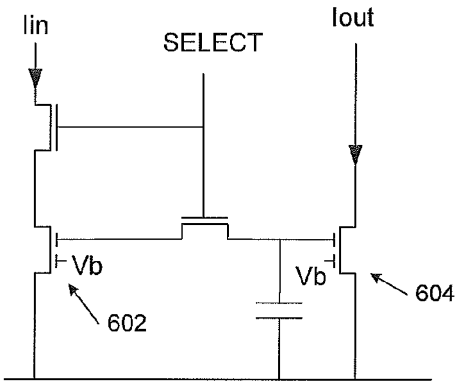
FIGS. 6*a* and 6*b* show, respectively, an example of a floating gate current mirror circuit for a pixel circuit, and an example of an active matrix sensor circuit incorporating a floating gate thin film transistor.

FIG. 6*a* shows an example of a current mirror circuit which may be incorporated into an active matrix pixel driver circuit using one, or as illustrated two, floating gate transistors 602, 604. In the example shown, one or both of the second input terminals may be coupled to a bias voltage Vb to adjust one or both threshold voltages of transistors 602, 604 for example to better match the characteristics of the two transistors. A similar arrangement may be used in a current copier circuit. A further advantage of using one or more floating gate devices is that the required power supply can be reduced by reducing the threshold voltage of the drive TFT through controlling the gate voltage on one of the input terminals.

Figure 6B:
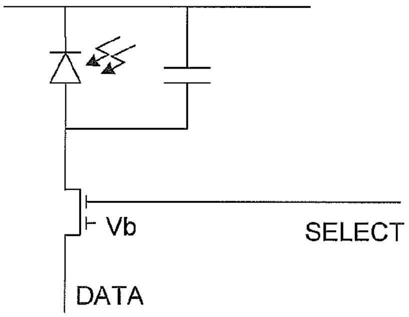

FIG. 6*b* shows an example of an active matrix pixel circuit for a sensor incorporating a floating gate TFT, again with threshold voltage adjustment as described above.

Figure 7A:
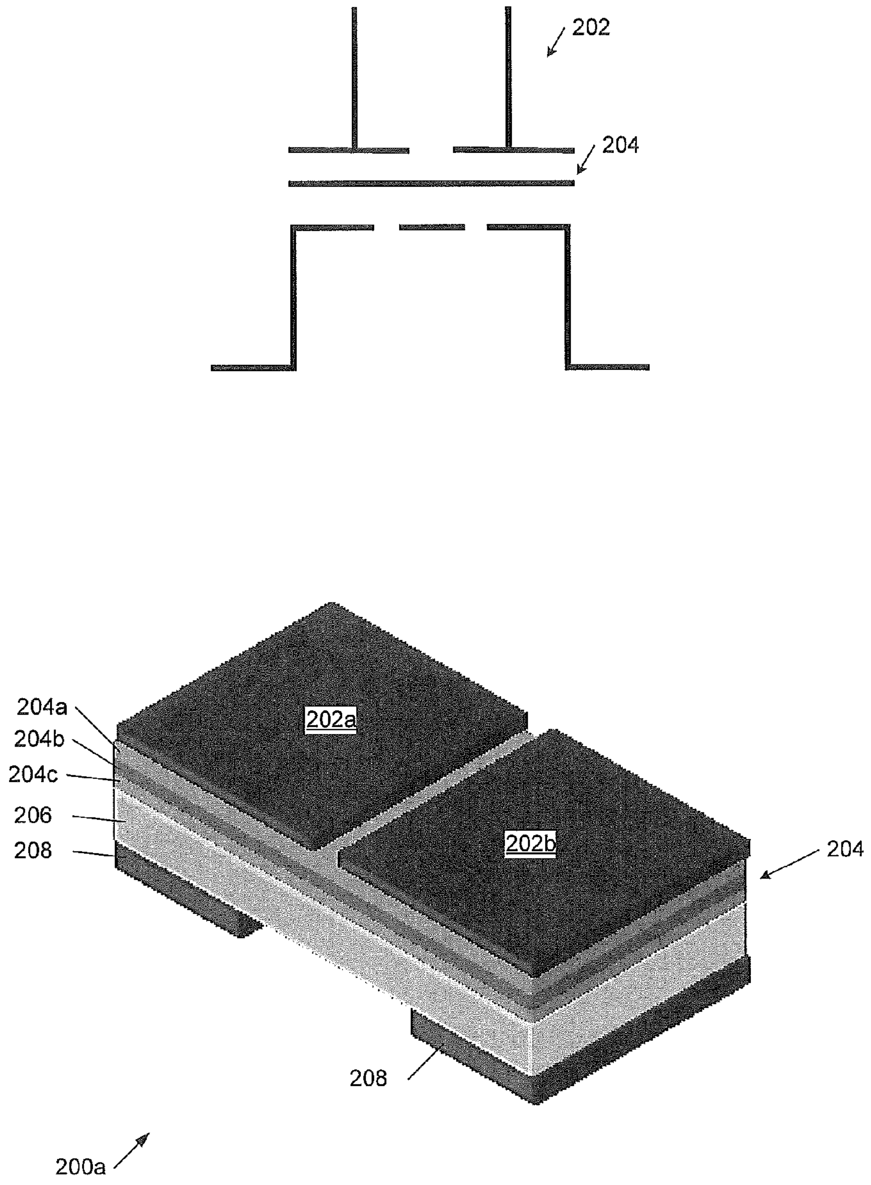
FIGS. 7*a* and 7*b* show, respectively, integrated and non-integrated floating gate device structures, and corresponding circuits, for an active matrix pixel circuit according to an embodiment of the invention.
Figure 7B:
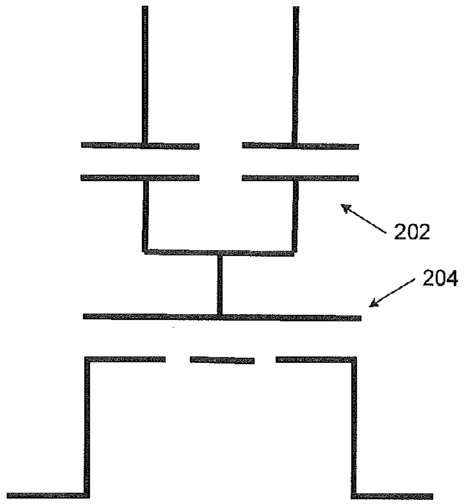
Figure 7B:
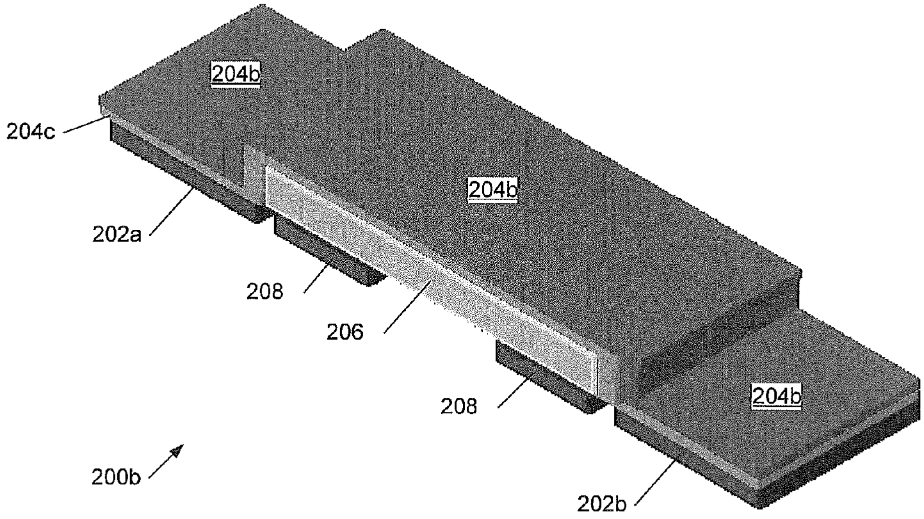

Referring to FIGS. 7*a* and 7*b*, these show integrated and non-integrated floating gate device structures and circuits. Like elements to those of FIG. 2 are indicated by like reference numerals.

FIG. 7*a* shows an embodiment of a floating gate (FG) TFT 200*a* with an integrated floating gate 204. In this integrated FG device the floating gate capacitor comprises a layer of gate metal 204*b* sandwiched between dielectric layers 204*a,c* to form a floating gate over semiconductor 206 and source and drain connections in source-drain metal 208. A first capacitively coupled input 202*a* forms a first input capacitor with a first portion of floating gate 204*b*, and a second capacitively coupled input 202*b* forms a second input capacitor with a second portion of floating gate 204*b*.

FIG. 7*b* shows an embodiment of a floating gate (FG) TFT 200*b* with a non-integrated floating gate, in which like elements to those of FIG. 7*a* are indicated by like reference numerals. Again in this structure a first capacitively coupled input 202*a* forms a first input capacitor with a first portion of floating gate metal 204*b*, and a second capacitively coupled input 202*b* forms a second input capacitor with a second portion of floating gate metal 204*b*. However, rather than the device having a vertical structure, the first and second capacitively coupled inputs are laterally disposed to either side of the source-drain contacts. This enables one plate of each input capacitor to be formed using the source-drain metal layer, and this enables the number of vias in a pixel drive circuit to be reduced. Further, as can be seen by comparison with FIG. 7*a*, there is one less metal layer and one less dielectric layer.

In preferred embodiments of the above circuits the transistors comprise MOS devices, for example fabricated from amorphous silicon. However, in other implementations one or more organic thin film transistors may be employed.

As the skilled person will understand the above described circuits may be implemented in either n- or p-channel variants. The skilled person will further understand that many other variations are possible and that, for example, one or the more of the circuits illustrated in FIGS. 1*c* to 1*g* may also be implemented using a floating gate drive transistor. More generally, virtually any pixel circuit described in the art may be configured to incorporate a floating gate TFT along the lines described above.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. An active matrix optoelectronic device having a plurality of active matrix pixels each said pixel including a pixel circuit comprising a thin film transistor (TFT) for driving the pixel and a pixel capacitor for storing a pixel value, wherein said TFT comprises a TFT with a floating gate, wherein said TFT with a floating gate comprises one or more connections to the floating gate, wherein said gate connections comprise only capacitively coupled connections to said floating gate, wherein said floating gate has an associated floating gate capacitance, and wherein said pixel capacitor comprises said floating gate capacitance.

2. An active matrix optoelectronic device as claimed in claim 1 wherein a said capacitively coupled gate connection comprises a gate connection capacitor with two plates, wherein said TFT comprises a source-drain metal layer, wherein a said capacitively coupled connection to said gate of said TFT comprises a connection patterned in said source-drain metal layer, a said connection patterned in said source-drain metal layer comprising one of said plates of a said gate connection capacitor, and wherein said TFT further comprises a layer of gate metal, said layer of gate metal comprising a second of said plates of a said gate connection capacitor.

3. An active matrix optoelectronic device as claimed in claim 1 wherein said floating gate is integrated with said TFT.

4. An active matrix optoelectronic device as claimed in claim 1 wherein said device comprises an organic light emitting diode (OLED) display, and wherein said pixel circuit includes an OLED driven by said floating gate TFT.

5. An active matrix optoelectronic device as claimed in claim 4 wherein said pixel circuit comprises a voltage programmed pixel circuit, and wherein said pixel value comprises a threshold offset voltage value to offset a threshold voltage of said floating gate TFT.

6. An active matrix optoelectronic device as claimed in claim 5 wherein said floating gate TFT has two floating gate connections and wherein said voltage programmed pixel circuit is configured to use a first floating gate connection to adjust said threshold offset voltage value and a second floating gate connection to store a programming voltage for the pixel.

7. An active matrix optoelectronic device as claimed in claim 6 wherein said pixel circuit is configured such that the action of providing said threshold voltage offset and said programming voltage stores a programming voltage on an intrinsic device capacitance between said floating gate and a source or drain terminal of said TFT.

8. An active matrix optoelectronic device as claimed in claim 5 wherein said pixel circuit includes a photodiode coupled to a floating gate connection of said TFT to provide optical feedback within a said pixel.

9. An active matrix optoelectronic device as claimed in claim 4 further comprising a control circuit to control said pixel circuit, said control circuit having two cycles, a first cycle is which said OLED is controlled to be off and said threshold offset voltage value is stored on said integrated floating gate capacitor, and a second cycle in which a brightness of said OLED is set by a programming voltage adjusted by said threshold offset voltage value.

10. An active matrix optoelectronic device as claimed in claim 4 wherein a said pixel circuit comprises a current programmed pixel circuit, and wherein said pixel value comprises a gate-source voltage value corresponding to a drive current through said OLED substantially proportional to a programming current applied to said pixel circuit.

11. An active matrix optoelectronic device as claimed in claim 10 wherein said TFT has a first floating gate connection and a second floating gate connection and wherein said current programmed pixel circuit is configured such that one of said floating gate connections comprises a connection to a capacitor to store a voltage to modulate an effective threshold voltage of said TFT.

12. An active matrix optoelectronic device as claimed in claim 11 wherein said first floating gate connection is coupled to a drain connection of said floating gate TFT.

13. An active matrix optoelectronic device as claimed in claim 12 wherein said first floating gate connection is coupled to said drain connection of said TFT, via at least one select TFT to enable said pixel circuit to be selected for programming by said programming circuit.

14. An active matrix optoelectronic device as claimed in claim 11 wherein said pixel circuit includes at least one select TFT coupled between said second floating gate connection and a drain connection of floating gate TFT.

15. An active matrix optoelectronic device as claimed in claim 11 wherein said pixel circuit includes at least one select TFT coupled between said first floating gate connection and a bias voltage connection of said pixel circuit.

16. An active matrix optoelectronic device as claimed in claim 11 wherein said pixel circuit includes at least one select TFT coupled between said second floating gate connection and a current data line to selectively provide said programming current to said pixel circuit.

17. An active matrix optoelectronic device as claimed in claim 11 further comprising a disable TFT coupled between said floating gate TFT and said OLED for disabling illumination from said OLED during programming of said pixel drive circuit.

18. An active matrix optoelectronic device as claimed in claim 1 wherein said floating gate TFT has two floating gate connections and wherein said pixel circuit is configured to use one of said input terminals for effective threshold voltage control of said floating gate TFT.

19. An active matrix optoelectronic device as claimed in claim 18 wherein said pixel circuit is configured to enable programming of a said active matrix pixel using another of said floating gate connections.

20. An active matrix optoelectronic device as claimed in claim 18 wherein said pixel circuit comprises a current minor or current copier circuit including said floating gate TFT as an input or an output transistor.

21. A method of driving an active matrix pixel circuit of an organic electroluminescent display, said pixel circuit comprising a thin film transistor (TFT) for driving the pixel a pixel capacitor for storing a pixel value, wherein said TFT comprises a TFT with a floating gate, wherein said floating gate comprises only capacitively coupled connections and has an associated floating gate to source capacitance, the method comprising programming said pixel circuit to store a voltage on said floating gate to source capacitance, wherein said stored voltage defines a brightness of said organic electroluminescent display element.

22. A method as claimed in claim 21 wherein said floating gate TFT has two floating gate connections, and wherein the method comprises programming said brightness of said organic electroluminescent display element using a first of said floating gate connections and modulating a threshold voltage of said drive TFT using a second of said floating gate connections.

* * * * *